(12) United States Patent
Yamada

(10) Patent No.: US 10,833,255 B2
(45) Date of Patent: Nov. 10, 2020

(54) METHOD FOR MANUFACTURING MAGNETIC TUNNEL JUNCTION ELEMENT, AND INDUCTIVELY COUPLED PLASMA PROCESSING APPARATUS

(71) Applicant: HITACHI HIGH-TECH CORPORATION, Tokyo (JP)

(72) Inventor: Masaki Yamada, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 143 days.

(21) Appl. No.: 16/080,614

(22) PCT Filed: Sep. 21, 2017

(86) PCT No.: PCT/JP2017/034068
§ 371 (c)(1),
(2) Date: Aug. 28, 2018

(87) PCT Pub. No.: WO2018/131215
PCT Pub. Date: Jul. 19, 2018

(65) Prior Publication Data
US 2019/0088865 A1 Mar. 21, 2019

(51) Int. Cl.
H01L 43/12 (2006.01)
H01L 27/22 (2006.01)
(Continued)

(52) U.S. Cl.
CPC ............... H01L 43/12 (2013.01); C23F 4/00 (2013.01); H01J 37/321 (2013.01);
(Continued)

(58) Field of Classification Search
CPC ..... H01L 43/12; H01L 21/302; H01L 27/226; H01L 43/08; H01L 43/10; C23F 4/00; H01J 37/321; H01J 37/32449; H01J 2237/3341
See application file for complete search history.

(56) References Cited

U.S. PATENT DOCUMENTS 7,948,044 B2  5/2011  Horng et al.
8,796,042 B2  8/2014  Shin et al.
(Continued)

FOREIGN PATENT DOCUMENTS

JP   H08-253881 A   10/1996
JP   2004-356179 A  12/2004
(Continued)

OTHER PUBLICATIONS

S. Ikeda et al., "A perpendicular-anisotropy CoFeB—MgO magnetic tunnel junction," Nature Materials vol. 9 (Sep. 2010), pp. 721 to 724.
(Continued)

Primary Examiner — Anita K Alanko
(74) Attorney, Agent, or Firm — Miles & Stockbridge, P.C.

(57) ABSTRACT

There is provided a method for manufacturing a magnetic tunnel junction element which prevents properties degradation due to hydrogen ions, and to which RIE processing that is capable of securing an etching shape is applied. A multilayer film which has a magnetic film and an oxidation film, of which a thickness of the magnetic film is 2 nm or less, and of which the magnetic film and the oxidation film have an interface in a film surface direction is generated, a mask layer that is patterned is formed on the multilayer film, etching is performed with respect to the multilayer film on which the mask layer is formed, by using a mixed gas of a hydrogen gas and a nitrogen gas as a reaction gas, and a ratio (Continued)

of a flow rate of the hydrogen gas to a flow rate of the mixed gas is 50% or less.

6 Claims, 8 Drawing Sheets

(51) Int. Cl.
  *H01J 37/32* (2006.01)
  *H01L 21/302* (2006.01)
  *C23F 4/00* (2006.01)
  *H01L 43/08* (2006.01)
  *H01L 43/10* (2006.01)

(52) U.S. Cl.
  CPC ...... *H01J 37/32449* (2013.01); *H01L 21/302* (2013.01); *H01L 27/226* (2013.01); *H01J 2237/3341* (2013.01); *H01L 43/08* (2013.01); *H01L 43/10* (2013.01)

(56) References Cited

U.S. PATENT DOCUMENTS

| | | |
|---|---|---|
| 9,564,577 B1 | 2/2017 | Hsu et al. |
| 2003/0180968 A1 | 9/2003 | Nallan et al. |
| 2003/0219984 A1 | 11/2003 | Ying et al. |
| 2004/0198062 A1 | 10/2004 | Ye et al. |
| 2005/0016957 A1 | 1/2005 | Kodaira et al. |
| 2005/0048675 A1 | 3/2005 | Ikeda |
| 2012/0135543 A1 | 5/2012 | Shin et al. |
| 2012/0276657 A1 | 11/2012 | Joubert et al. |
| 2013/0048599 A1 | 2/2013 | Satake et al. |
| 2013/0146997 A1 | 6/2013 | Lee et al. |
| 2013/0149499 A1 | 6/2013 | Lee et al. |
| 2013/0234267 A1 | 9/2013 | Kim et al. |
| 2014/0138347 A1 | 5/2014 | Toyosato et al. |
| 2014/0144873 A1 | 5/2014 | Yoshida et al. |
| 2015/0017741 A1 | 1/2015 | Fujita et al. |
| 2015/0194315 A1 | 7/2015 | Ishimaru et al. |
| 2016/0005602 A1 | 1/2016 | Yoo et al. |
| 2017/0200886 A1 | 7/2017 | Morimoto et al. |
| 2017/0221682 A1 | 8/2017 | Nishimura et al. |
| 2020/0168791 A1* | 5/2020 | Hsu ....................... G11C 11/161 |

FOREIGN PATENT DOCUMENTS

| | | |
|---|---|---|
| JP | 2005-042143 | 2/2005 |
| JP | 2005277249 A | 10/2005 |
| JP | 2006-278456 A | 10/2006 |
| JP | 2008-065944 A | 3/2008 |
| JP | 2013-051227 A | 3/2013 |
| JP | 2015-018885 | 1/2015 |
| JP | 2016-046470 | 4/2016 |
| JP | 2016082020 A | 5/2016 |
| KR | 10-0814901 B1 | 3/2008 |
| KR | 2013-0024705 A | 3/2013 |
| KR | 2013-0063873 A | 6/2013 |
| KR | 101585552 B1 | 1/2016 |
| TW | 201230142 A | 7/2012 |
| TW | 201327676 A | 7/2013 |
| TW | 201338224 A | 9/2013 |
| TW | 201729413 A | 8/2017 |
| WO | 2012/176747 A1 | 2/2015 |

OTHER PUBLICATIONS

M. Satake and M. Yamada, "Degradation of perpendicular magnetic anisotropy in CoFeB film after H2 plasma irradiation," Japanese Journal of Applied Physics, vol. 56, pp. 046202-1 to 046202-5 (2017).

International Search Report dated Nov. 14, 2017 for International Application No. PCT/JP2017/034068.

Office Action dated Jun. 28, 2019 in corresponding Taiwanese Application No. 107117313.

Office Action dated Sep. 23, 2019 in corresponding Korean Application No. 10-2018-7021789.

Office Action for Taiwan Application No. 10520115380 dated Jan. 28, 2016.

Office Action dated Dec. 27, 2016 for Japanese Application No. 2013-144118.

* cited by examiner

[Fig. 1A]
(1) IN-PLANE MAGNETIZATION FILM: SOLID FILM
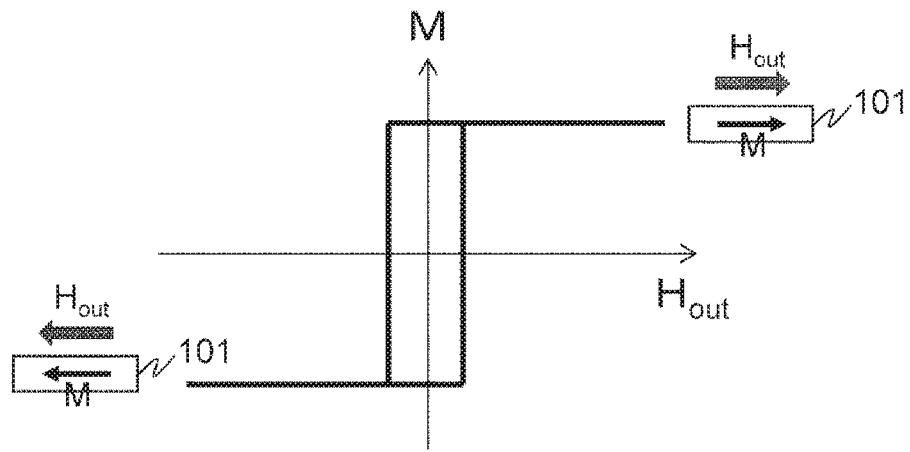
(2) IN-PLANE MAGNETIZATION FILM: AFTER CO/NH$_3$ PROCESSING
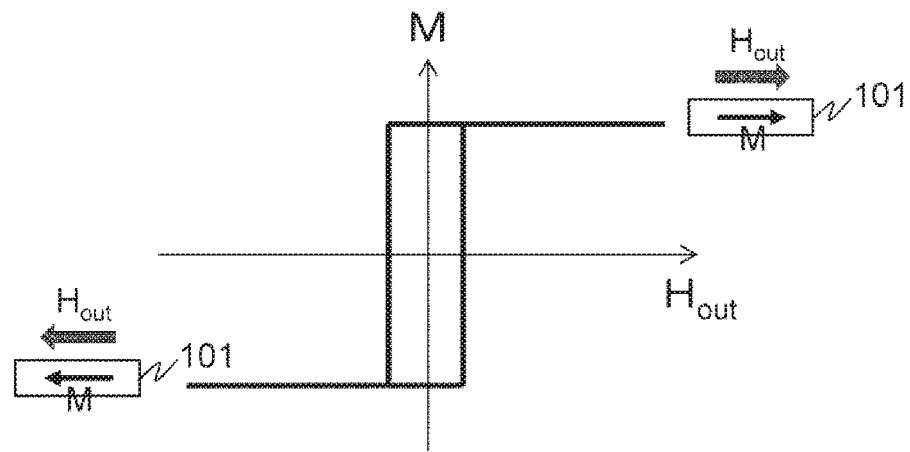

[Fig. 1B]
(1) PERPENDICULAR MAGNETIZATION FILM: SOLID FILM
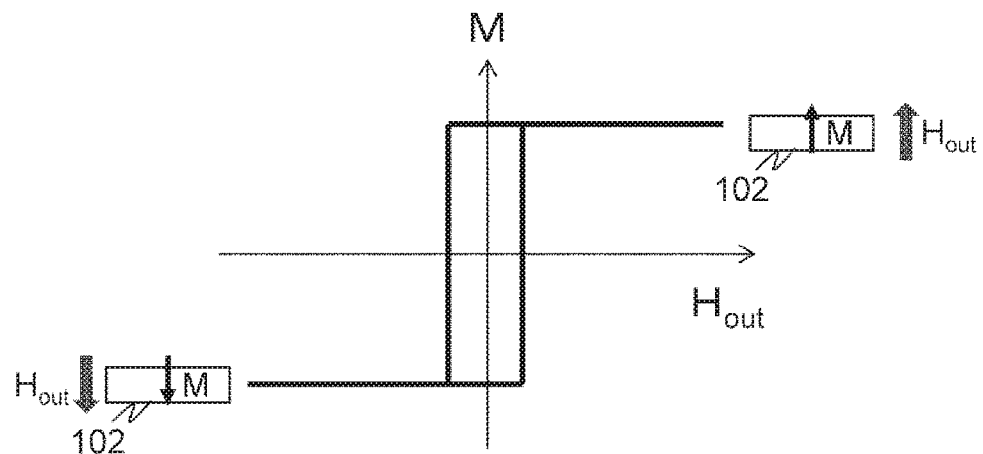
(2) PERPENDICULAR MAGNETIZATION FILM: AFTER CO/NH₃ PROCESSING
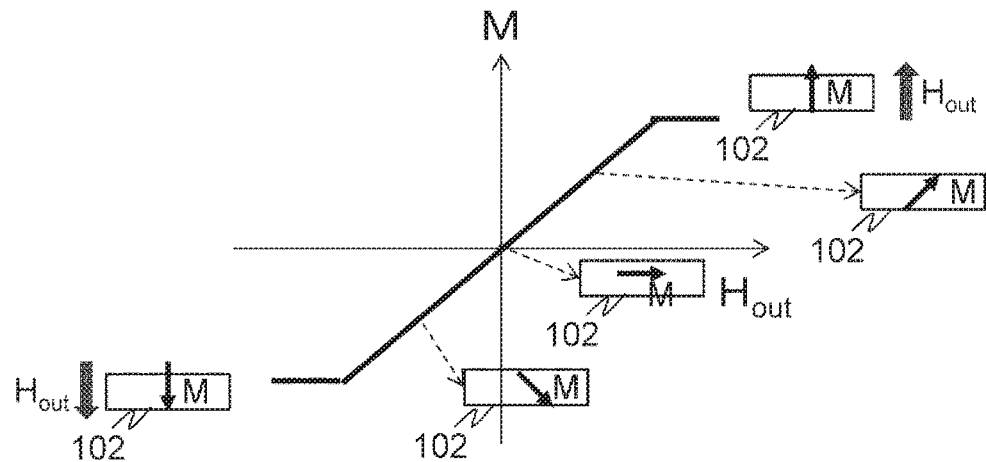

[Fig. 2]
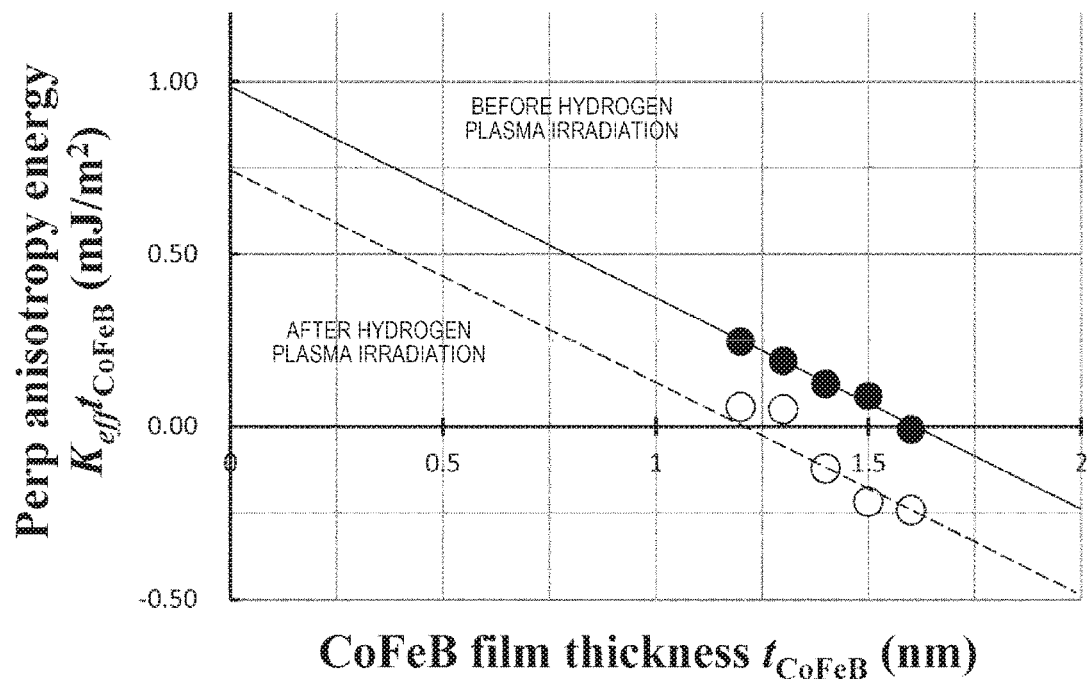
[Fig. 3A]
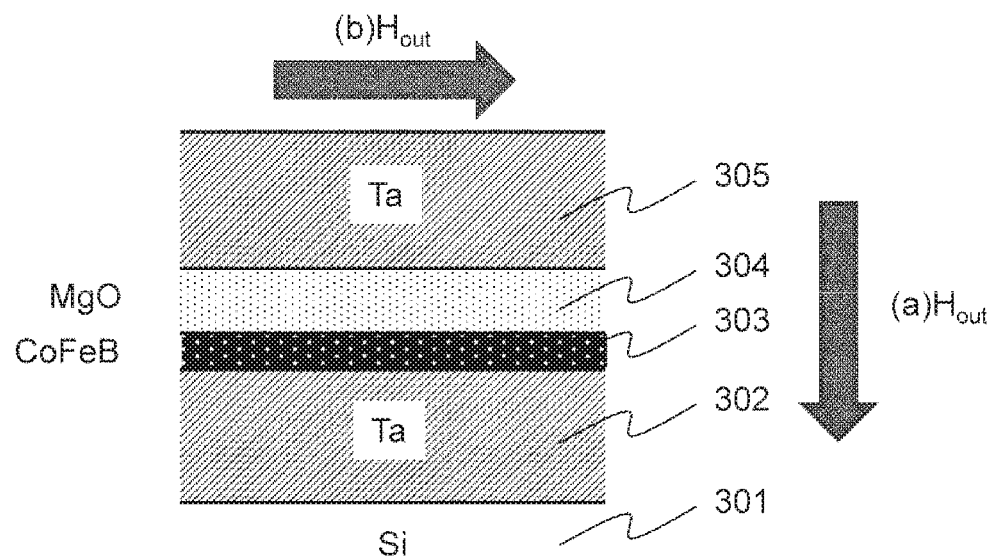

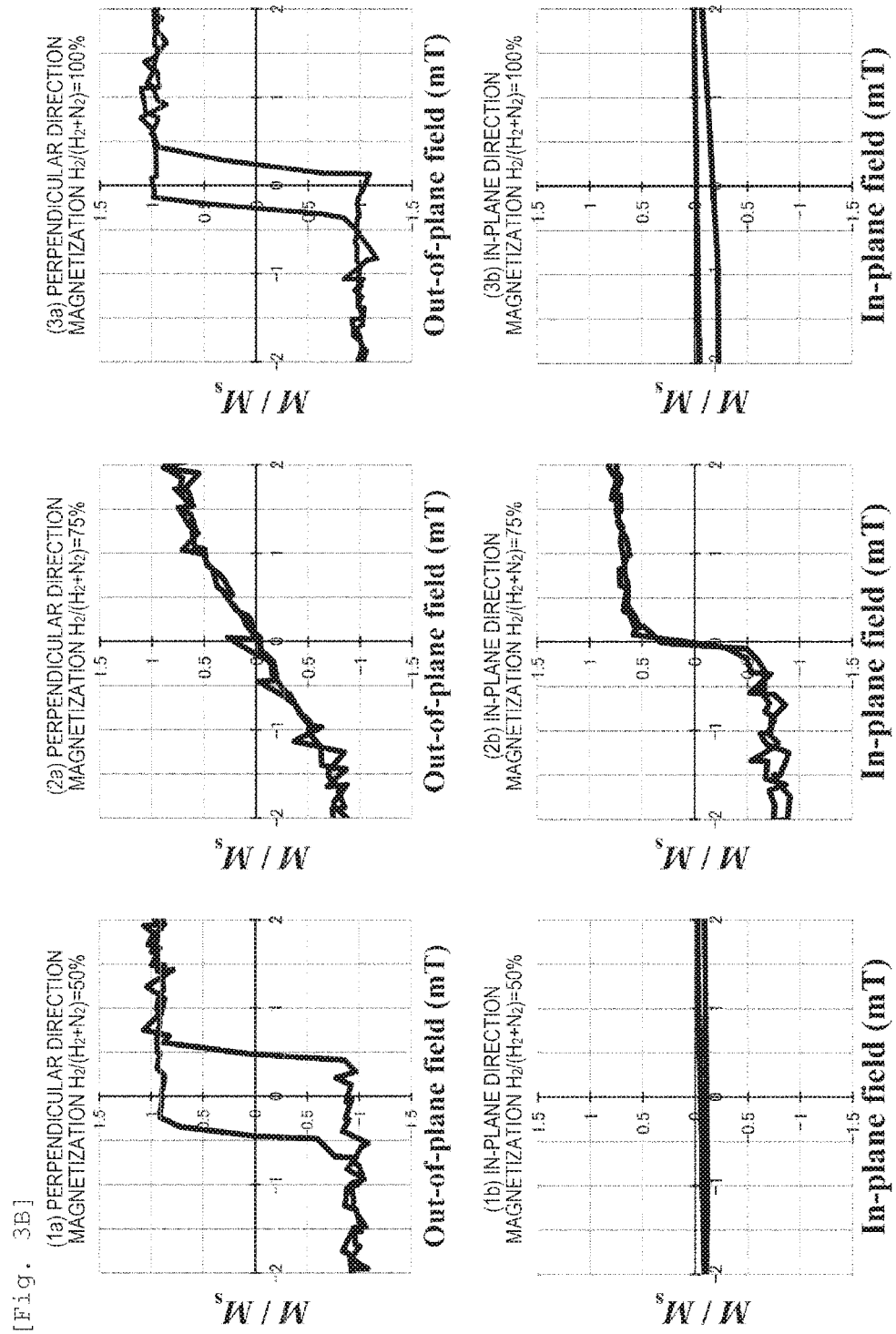
[Fig. 3B]

[Fig. 4]
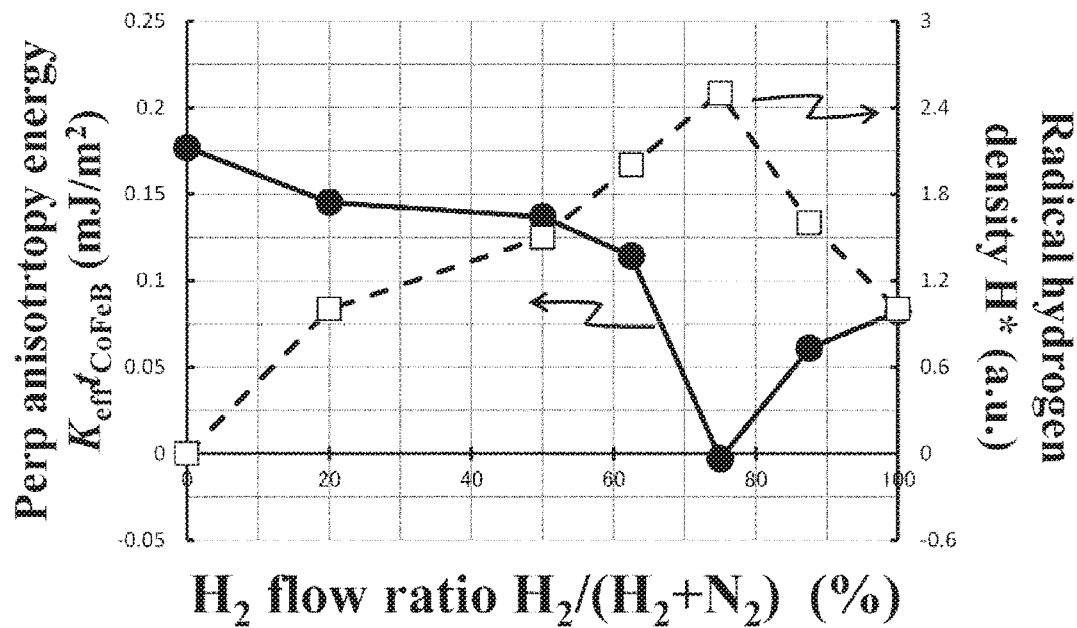
[Fig. 5]
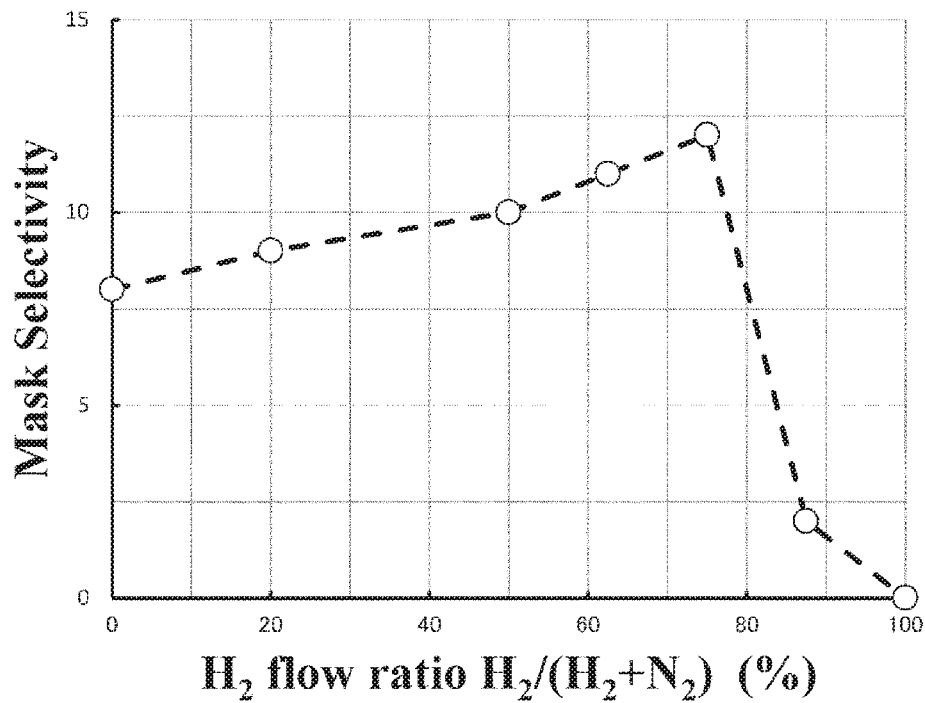

[Fig. 6]
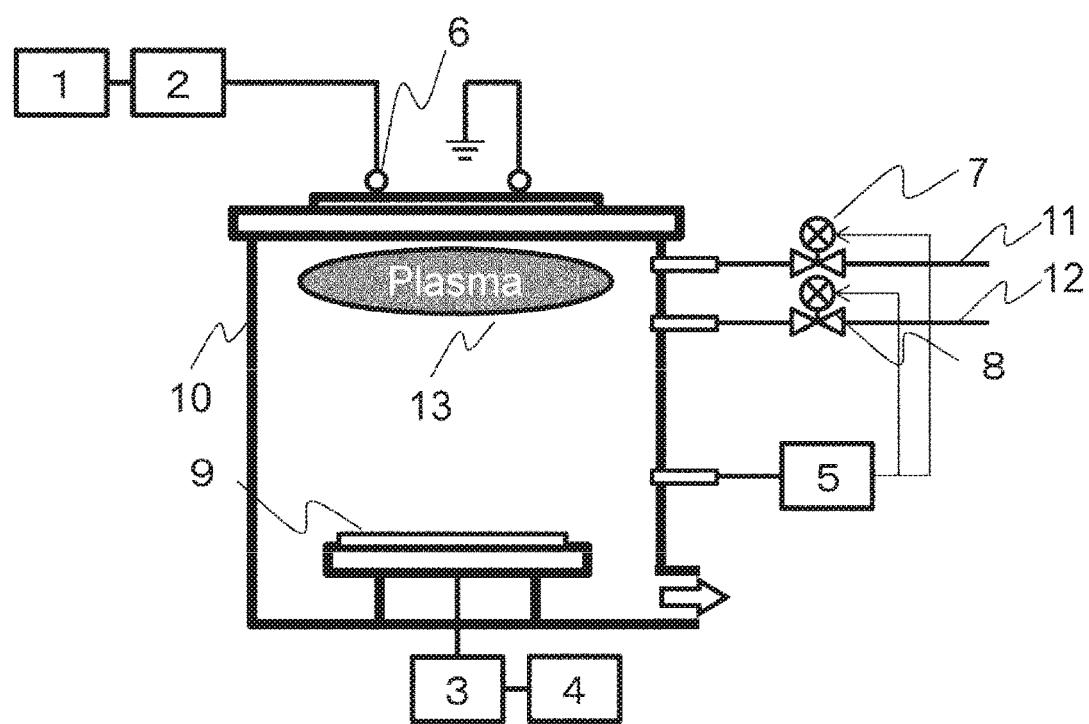

[Fig. 7]
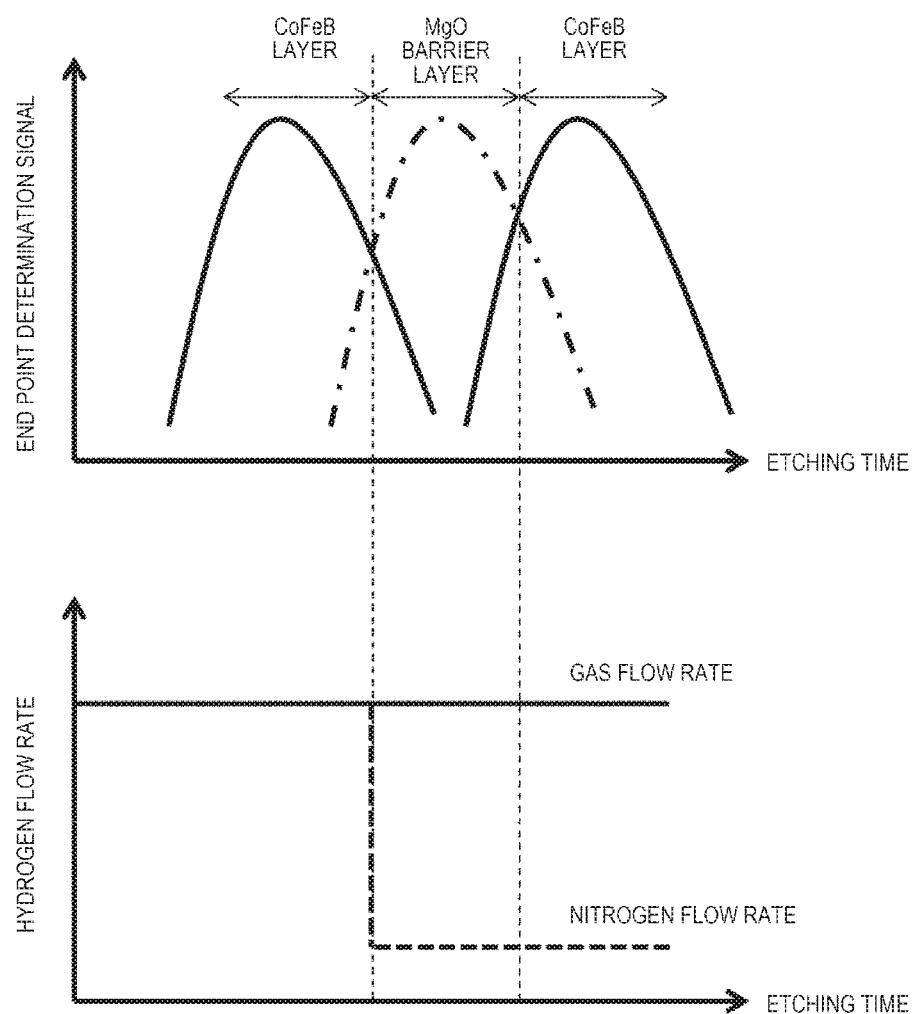

[Fig. 8]
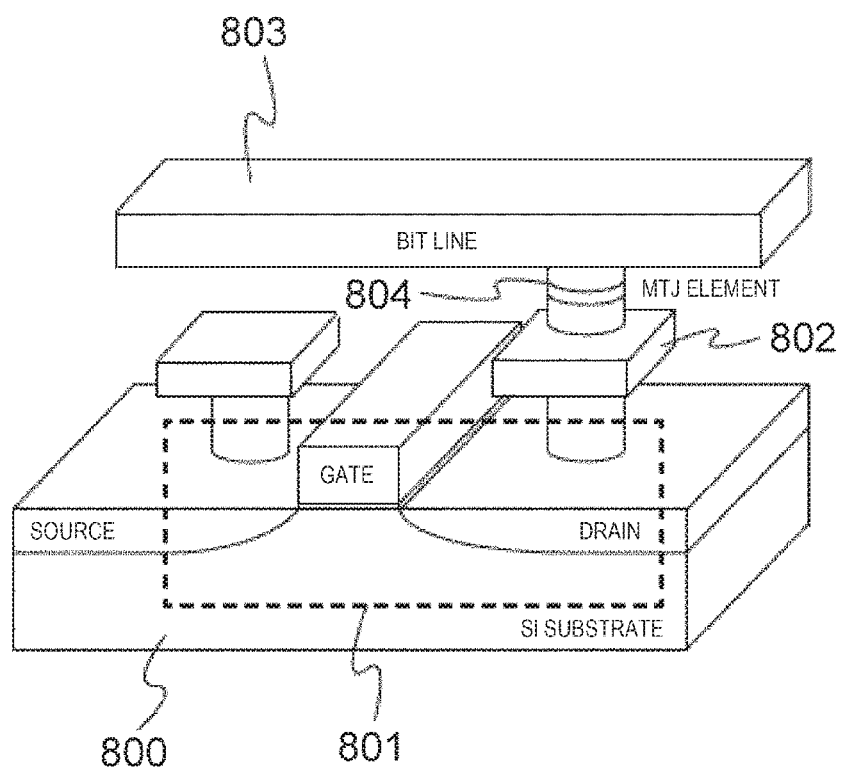

METHOD FOR MANUFACTURING MAGNETIC TUNNEL JUNCTION ELEMENT, AND INDUCTIVELY COUPLED PLASMA PROCESSING APPARATUS

TECHNICAL FIELD

The present invention relates to a plasma treatment apparatus, and particularly to a processing damage restraint method for a perpendicular magnetization MRAM (Magnetoresistive Random Access Memory).

BACKGROUND ART

There is a high need for a STT-MRAM (Spin Transfer Torque Magnetic-resistive Random Access Memory) which causes a magnetic tunnel junction (MTJ) element to function as a storage element, as a nonvolatile memory from the viewpoint of an operating speed, a rewriting tolerance, and high integration. Along with refinement, for the purpose of securing thermal stability and reducing a rewriting electrical current value, a material of the MTJ element is shifted to a perpendicular magnetization film having perpendicular magnetic anisotropy from an in-plane magnetization film having in-plane magnetic anisotropy. For example, as a perpendicular magnetization film for the MTJ element, CoFeB which uses interfacial magnetic anisotropy between MgO and CoFeB is a textbook example thereof (NPL 1).

Along with a change of the material of the MTJ element, a processing method of the STT-MRAM is necessarily modified. As a magnetic film processing method for the STT-MRAM, a reactive ion etching (RIE) processing method which uses $CO/NH_3$ (PTL 1) or alcohol (PTL 2) is proposed.

CITATION LIST

Patent Literature

PTL 1: JP-A-H8-253881
PTL 2: JP-A-2005-42143

Non-Patent Literature

NPL 1: S. Ikeda et al., "A perpendicular-anisotropy CoFeB—MgO magnetic tunnel junction" Nature Materials vol. 9 (September 2010) p. 721 to 724
NPL 2: M. Satake and M. Yamada, "Degradation of perpendicular magnetic anisotropy in CoFeB film after H2 plasma irradiation" Japanese Journal of Applied Physics vol. 56, 046202 (2017)

SUMMARY OF INVENTION

Technical Problem

A damage due to the RIE processing is manifested in the perpendicular magnetization film which uses the interfacial magnetic anisotropy between an oxidation film and a magnetic substance. As an example thereof, a schematic diagram of magnetic properties of the MTJ element after element processing by using $CO/NH_3$ is illustrated. FIG. 1A is a diagram relating to an in-plane magnetization film, and FIG. 1B is a diagram relating to a perpendicular magnetization film, and FIGS. 1A and 1B illustrate (1) magnetic properties of a solid film, (2) magnetic properties of a magnetization film obtained by performing $CO/NH_3$ processing with respect to the solid film. A horizontal axis indicates a magnitude of an external magnetic field $H_{OUT}$ which is applied to the film, and a vertical axis indicates a magnitude of magnetization M of the magnetization film. As illustrated in FIG. 1A, noticeable degradation of the magnetic properties does not occur in a case of the in-plane magnetization film. Even in any case of (1) the solid film, and (2) after the processing, if the magnitude of the external magnetic field $H_{OUT}$ exceeds a predetermined threshold value, an orientation of in-plane magnetization in a magnetization film 101 is switched in accordance with the orientation of the external magnetic field $H_{OUT}$. On the contrary, as illustrated in FIG. 1B, in a case of the perpendicular magnetization film, the magnetic anisotropy in a magnetization film 102 is changed to the in-plane magnetic anisotropy from the perpendicular magnetic anisotropy, and the orientation of the magnetization of the magnetization film 102 is gently switched, in the magnetization film obtained by performing the $CO/NH_3$ processing.

NPL 2 describes an influence of hydrogen ($H_2$) plasma on magnetic properties in a multilayer film of MgO and CoFeB, and degradation of a perpendicular magnetization MTJ properties element by etching which uses $CO/NH_3$ is estimated that the influence mainly due to the hydrogen plasma is large. Therefore, in the present invention, there is provided a method for manufacturing a magnetic tunnel junction element which prevents properties degradation due to hydrogen ions, and to which RIE processing that is capable of securing an etching shape is applied.

Solution to Problem

According to an aspect of the present invention, there is provided a method for manufacturing a magnetic tunnel junction element including fabricating a multilayer film which has a magnetic film including at least one of Co, Ni, and Fe, and an oxidation film including at least one of Mg, Zn, and Al, of which a thickness of the magnetic film is 2 nm or less, and of which the magnetic film and the oxidation film have an interface in a film surface direction, forming a mask layer that is patterned on the multilayer film, and performing etching with respect to the multilayer film on which the mask layer is formed, by using a mixed gas of a hydrogen gas and a nitrogen gas as a reaction gas, in which a flow ratio of a flow rate of the hydrogen gas to a flow rate of the mixed gas is 50% or less.

Other problems and new characteristics will be clear from the description of the present specification, and the accompanying drawings.

Advantageous Effects of Invention

In a manufacturing process of the magnetic tunnel junction element, it is possible to achieve both reducing of the damage due to the RIE and securing of the etching shape.

BRIEF DESCRIPTION OF DRAWINGS

FIG. 1A is a diagram for describing a change of magnetic properties by $CO/NH_3$ processing in an in-plane magnetization film.

FIG. 1B is a diagram for describing a change of magnetic properties by $CO/NH_3$ processing in a perpendicular magnetization film.

FIG. 2 is a diagram illustrating perpendicular magnetic anisotropy energy of CoFeB before and after hydrogen plasma irradiation.

FIG. 3A is a diagram illustrating a layer-stacked film that is used for measuring magnetic properties of a CoFeB perpendicular magnetization film.

FIG. 3B is a diagram illustrating the magnetic properties of the CoFeB perpendicular magnetization film which is irradiated with hydrogen/nitrogen mixed plasma.

FIG. 4 is a diagram illustrating dependency on a hydrogen flow ratio of perpendicular magnetic anisotropy energy of the CoFeB perpendicular magnetization film.

FIG. 5 is a diagram illustrating the dependency on the hydrogen flow ratio of a Ta mask selectivity of the CoFeB perpendicular magnetization film.

FIG. 6 is an outline diagram of a plasma etching processing apparatus.

FIG. 7 is a diagram for describing a gas flow ratio adjustment sequence of hydrogen/nitrogen.

FIG. 8 is a bird's-eye view of 1 bit of an MRAM.

DESCRIPTION OF EMBODIMENTS

In order to prevent an influence of hydrogen plasma, etching with a mixed gas of nitrogen and hydrogen is provided with respect to a perpendicular magnetization film. At that time, in a case where a hydrogen flow rate is referred to as H2, and a nitrogen flow rate is referred to as N2, a hydrogen flow ratio is set to be H2/(H2+N2) 50%. Hereinafter, details thereof will be described.

FIG. 2 illustrates results of dependency on a film thickness of perpendicular magnetic anisotropy energy of a COFeB perpendicular magnetization film before and after irradiation with the hydrogen plasma. As a film thickness t of a magnetic layer becomes large, the perpendicular magnetic anisotropy energy of the CoFeB perpendicular magnetization film becomes small, and does not function as a perpendicular magnetization film. The thickness of a magnetic film indicating properties as a perpendicular magnetization film is 2 nm or less, although the thickness depends on each material and a combination of the magnetic film and a barrier layer (here, MgO). In general, perpendicular magnetization anisotropy energy $K_{eff}$ of a magnetic substance is expressed by (Math. 1) which uses saturation magnetization $M_s$, and an effective anisotropic magnetic field $\mu_0 H_k$.

$$K_{eff} = \frac{1}{2}\frac{M_s}{\mu_0}\mu_0 H_k \equiv \frac{1}{2}\frac{M_s}{\mu_0}(\mu_0 H_s - M_s) = \qquad \text{(Math. 1)}$$
$$-\frac{1}{2}\frac{M_s^2}{\mu_0} + K_b + \frac{K_{int}}{t_{CoFeB}} \sim -\frac{1}{2}\frac{M_s^2}{\mu_0} + \frac{K_{int}}{t_{CoFeB}}$$

Here, $K_{int}$ represents the perpendicular magnetic anisotropy energy at a CoFeB/MgO interface (interface), $K_b$ represents the perpendicular magnetic anisotropy energy of a bulk of CoFeB, $H_s$ represents a saturation magnetic field, and $\mu_0$ represents magnetic permeability in vacuum. Since the perpendicular magnetic anisotropy energy $K_b$ of the bulk of CoFeB is substantially 0, $K_{eff}$ is approximately proportional to an inverse number of a film thickness $t_{CoFeB}$ (NPL 1).

By (Math. 1), it is possible to estimate the interfacial perpendicular magnetic anisotropy energy $K_{int}$ at the CoFeB/MgO interface, and resultantly, in a case of being not irradiated with the hydrogen plasma, $K_{int}=1.0$ (mJ/m$^2$), but in a case of being irradiated with the hydrogen plasma, $K_{int}=0.75$ (mJ/m$^2$). This means that the perpendicular magnetic anisotropy at the CoFeB/MgO interface is reduced due to the irradiation with the hydrogen plasma. As a mechanism thereof, it is assumed that hydrogen ions reach the interface between MgO and CoFeB, thereby, MgO deteriorates, a hybridized orbital of Fe and O is modulated, and as a result, the perpendicular magnetic anisotropy is lowered. Since the hydrogen plasma lowers the magnetic anisotropy at the CoFeB/MgO interface in this manner, there is a need to reduce the hydrogen plasma.

FIG. 3B illustrates a magnetization measurement result of the CoFeB perpendicular magnetization film in a case where a layer-stacked film illustrated in FIG. 3A is irradiated with plasma obtained by mixing hydrogen and nitrogen. The layer-stacked film which is used in the measurement, has a structure in which a Ta layer 302, a CoFeB layer 303, a MgO layer 304, and a Ta layer 305 are stacked in sequence on a silicon substrate 301. A film thickness of the CoFeB layer 303 is 1.2 nm, the film thickness of the MgO layer 304 is 2 nm, and the film thicknesses of the Ta layers 302 and 305 are 5 nm. The measurement is performed by three kinds of flow ratios, and the flow ratios are respectively, (1) hydrogen flow ratio of 50% (hydrogen 100 sccm, nitrogen 100 sccm), (2) hydrogen flow ratio of 75% (hydrogen 150 sccm, nitrogen 50 sccm), and (3) hydrogen flow ratio of 100% (hydrogen 200 sccm, nitrogen 0 sccm). Measurement conditions other than the flow ratio are the same. In the magnetization measurement, the measurement is performed by (a) applying an external magnetic field $H_{out}$ into a perpendicular direction with respect to a film surface direction, and (b) applying the external magnetic field $H_{out}$ into a horizontal direction with respect to the film surface direction.

In FIG. 3B, (1a), (2a), and (3a) illustrate the results in a case where the external magnetic field is applied into the perpendicular direction with respect to the film surface direction at each flow ratio, and (1b), (2b), and (3b) illustrate the results in a case where the external magnetic field is applied into the horizontal direction with respect to the film surface direction at each flow ratio. In a case where the hydrogen flow ratio is 50%, the magnetization of the perpendicular direction, coercive force is to be Hc=0.5 mT (1a), and magnetic properties is hardly changed in comparison with a case of no plasma irradiation. On the contrary, in a case where the hydrogen flow ratio is 100%, the coercive force of CoFeB is to be Hc=0.25 mT (3a), and the magnetic properties is reduced up to approximately a half thereof. Particularly, in a case where the hydrogen flow ratio is 75%, degradation of the perpendicular magnetic anisotropy is most noticeable, the coercive force thereof is 0, and an easy axis direction of the magnetization is changed to an in-plane direction from the perpendicular direction (2a, 2b).

In order to check up the dependency on the hydrogen flow ratio of the perpendicular magnetic anisotropy in detail, the dependency on the hydrogen flow ratio of the perpendicular magnetic anisotropy energy of CoFeB is calculated. The result thereof is illustrated in FIG. 4. The layer-stacked film which is used in a test, and the measurement conditions are the same as those described in FIG. 3. From the present result, in a case where the hydrogen flow ratio is 50% or less, the perpendicular magnetic anisotropy energy (which is indicated by a black circle) is gradually reduced along with an increase of the hydrogen flow ratio, but on the contrary, the perpendicular magnetic anisotropy energy is sharply reduced in a region in which the hydrogen flow ratio is 60% or more and 75% or less. In a case where the hydrogen flow ratio is 75% or more, the perpendicular magnetic anisotropy energy is increased again, and in a case of the plasma irradiation of hydrogen alone, the energy becomes approximately a half thereof in comparison with an initial state. In other words, it is found out that the etching with a hydrogen content which is close to a $NH_3$ composition most degrades the magnetic properties of the perpendicular magnetization.

FIG. 4 illustrates a radical hydrogen density (which is indicated by a square) at each measured hydrogen flow ratio. From this, the dependency on the hydrogen flow ratio of the perpendicular magnetic anisotropy energy is read by being related to an amount of the hydrogen ions or the radical hydrogen in the mixed gas plasma. If the dependency on the hydrogen flow ratio of the radical hydrogen density is measured, the result that the radical hydrogen density is highest is obtained at a point of the flow ratio of 75% which is close to the $NH_3$ composition.

Qualitatively, it is understood as follows. First, in a case where the hydrogen flow ratio is low, since the hydrogen ions or species of radicals are small, the influence of hydrogen on the perpendicular magnetization is small. On the other hand, if the hydrogen flow ratio is in a certain region, a divergence of hydrogen in the mixed gas plasma is promoted, and as a result, an absolute amount of the hydrogen ions and the radical hydrogen is increased. In the present test, since presence of nitrogen is indispensable in order to promote the divergence of hydrogen, and the amount of nitrogen is relatively reduced in a case where the hydrogen flow ratio is excessively large, for example, under a condition that the hydrogen flow ratio is 100%, the influence of hydrogen on the perpendicular magnetization is not so large. As a result, it is concluded that the properties of the perpendicular magnetization is most degraded at a point of the hydrogen flow ratio of 75%, and there is a need to make the hydrogen flow ratio small in order to secure the magnetic properties.

On the other hand, in etching processing of the magnetic film under the mixed gas by using hydrogen and nitrogen, there is a problem that a mask selectivity in the etching is lowered due to the reduction of the hydrogen flow ratio. FIG. 5 illustrates the dependency on the hydrogen flow ratio of the mask selectivity in a case where the CoFeB perpendicular magnetization film is processed by using plasma obtained by mixing hydrogen and nitrogen. Ta is used as a mask, and the mask selectivity is defined as an etching rate of CoFeB/ an etching rate of Ta. In a case where the hydrogen flow ratio is small, the selectivity is gradually increased along with the increase of the hydrogen flow ratio, and it is possible to obtain a maximum mask selectivity at a point of flow ratio 75%. If the flow ratio is further increased, the etching rate of CoFeB is excessively reduced, and it is not possible to etch CoFeB in a case of hydrogen of 100%. From this result, it is possible to say that the hydrogen flow ratio in the vicinity of 75% is the most suitable value in order to process an MTJ element, from the viewpoint of the mask selectivity.

If the findings are integrated, in a case where CoFeB of the perpendicular magnetization is considered as a material which is to be etched, it is found out that there is a trade-off relationship between making of a low damage and securing of an etching shape, in the etching of which the hydrogen flow ratio is in the vicinity of 75%. On the other hand, in the region in which the hydrogen flow ratio is 50% or less, the dependency on the hydrogen flow ratio of the magnetic properties and the mask selectivity, along with the magnetic properties and the mask selectivity, are small. Therefore, in the region in which the hydrogen flow ratio is 50% or less, it is possible to achieve both making of the low damage and securing of the etching shape. Accordingly, as a processing method of the MTJ element in a perpendicular magnetization MRAM, proposed is a processing method in which the mixed gas of hydrogen and nitrogen is used, and the hydrogen flow ratio thereof is 50% or less.

It is useful to add a third gas in addition to the mixed gas of hydrogen and nitrogen. In a case where CO is used as a third additional gas, in comparison with a case where CO is not added, resultantly, the coercive force is increased as 60%. As a result, it is assumed that there is an effect of reducing the hydrogen ions or the radical hydrogen which is included in an etching gas, by scavenging due to oxygen in the additional gas. On the other hand, the mask selectivity is increased as approximately 20%, by adding CO. Thereby, the further low damage processing, and the improvement of the mask selectivity are expected, due to the addition of CO. As a gas having the same effect, $CO_2$ or a gas including O is considered. It is possible to use a gas which is diluted with a rare gas as a third additional gas. For example, in a case where the mixed gas of hydrogen and nitrogen is diluted with He, it is possible to prevent the influence of the hydrogen plasma which is included in the etching gas. In this case, the mask selectivity is slightly lowered if He is added, but a lowering rate thereof is less than 10%, and there is substantially no difference regarding the shape after the etching. Thereby, in the etching that uses the mixed gas of hydrogen and nitrogen in which the hydrogen flow ratio is 50% or less, it is possible to make the further low damage, by adding the third gas. It is possible to use Ne, Ar, Kr, Xe, or the like, in addition to He.

FIG. 6 illustrates an outline diagram of a plasma etching apparatus that performs the processing of the perpendicular magnetization film by using the gas. The present apparatus includes an antenna 6 for plasma generation, and a first radio frequency power source 1 and a first radio frequency matching device 2 for applying a radio frequency voltage thereto. Hydrogen is introduced into a reactor 10 through a first flow path 11, and nitrogen is introduced into the reactor 10 through a second flow path 12, and a radio frequency alternating electromagnetic field which is generated in the antenna 6 is acted on the mixed gas of hydrogen and nitrogen which are introduced, thereby, plasma 13 which is inductively coupled from reactant particles is generated. The apparatus includes a substrate voltage generator 4 and a second radio frequency matching device 3 for causing the processing with the generated plasma 13 to be performed. The apparatus includes an endpoint determination device 5 that is capable of monitoring a fluctuation of plasma which is generated at the time of processing a substrate 9, and has a mechanism that feeds back a signal which is obtained from the end point determination device 5 to a first mass flow controller 7 and a second mass flow controller 8. The first mass flow controller 7 is capable of adjusting the flow rate of hydrogen, and the second mass flow controller 8 is capable of adjusting the flow rate of nitrogen, in accordance with the signal of the end point determination device 5.

Meanwhile, the MTJ element is configured by the layer-stacked film at a level of several atomic layers, and ideally, the MTJ element ought to be etched by using a reactive gas corresponding to each configuration film. However, in a case where the reactive gases which are different from each other are used in general, there is a need to cut a plasma electric discharge for the etching every time, and there is a concern that treatment time of a wafer is greatly elongated. On the contrary, in the plasma etching which uses the mixed gas of hydrogen and nitrogen, even if the hydrogen flow ratio is changed, there is substantially no influence on the plasma electric discharge. Therefore, it is possible to select a desired hydrogen flow ratio while maintaining the plasma electric discharge.

With reference to FIG. 7, a flow rate adjustment sequence of hydrogen and nitrogen in a case where the MTJ element is etched will be described. FIG. 8 illustrates a bird's-eye view of 1 bit of the MTJ element in the MRAM. A selection transistor 801 is formed in a silicon substrate 800, and an MTJ element 804 is formed between a drain electrode 802 and a bit line 803 of the selection transistor 801. The MTJ element 804 includes a layer-stacked film structure in which an MgO barrier layer is interposed between magnetic layers (CoFeB layers). Since the magnetic layer is the perpendicular magnetization film, the thickness of the magnetic layer is 2 nm or less. One of the magnetic layers is a reference layer (fixed layer), and the other is a recording layer. A relationship between a magnetization direction of the recording layer and a magnetization direction of the reference layer is parallel/anti-parallel, thereby, it is possible to record the signal of 1/0. In the manufacturing for the MTJ element 804, after a multilayer film of a magnetic film (CoFeB layer)—an oxidation film (MgO layer)—a magnetic film (CoFeB layer) is generated, for example, a Ta cap layer is accumulated. The Ta film is patterned by photoresist, thereby, a mask layer is formed. An etching treatment described hereinafter is performed by using the patterned Ta film as a mask layer.

In the present sequence, in the plasma etching apparatus described in FIG. 6, in a case where the MgO barrier layer on which CoFeB is layer-stacked is detected by using the endpoint determination device 5, the hydrogen flow rate is dropped to reduce the hydrogen flow ratio. By such a sequence, it is possible to perform the etching with a gas ratio in which high selective properties are obtained without limiting the hydrogen flow rate in the CoFeB layer which is stacked above the MgO barrier layer. Along with the detection of the MgO barrier layer, the hydrogen flow rate is limited in the etching of the layer which is below the CoFeB—MgO interface, thereby, it is possible to reduce a hydrogen damage that is applied to the MgO barrier layer which is a key to the properties securing of the MTJ element.

Here, the processing treatment sequence of the variable hydrogen flow ratio corresponding to the simplest MTJ multilayer film configuration is introduced, but there is a need to change the hydrogen flow ratio in accordance with the configuration of the MTJ multilayer film, and it is not limited to the sequence which is introduced this time.

Hereupon, the invention which is made by the present inventors is specifically described based on embodiments, but the present invention is not limited to the embodiments, and can be variously modified in a scope without departing from the gist thereof. For example, the magnetic film configuring the perpendicular magnetization film is not limited to the CoFeB film, and may be any magnetic film so long as being a magnetic film including at least one of Co, Ni, and Fe, and the barrier layer is not limited to the MgO film, and may be any oxidation film so long as being an oxidation film including at least one of Mg, Zn, and Al.

EXAMPLE 1

Hereinafter, the measurement of the dependency on the hydrogen flow ratio of the perpendicular magnetic anisotropy energy of the CoFeB perpendicular magnetization film illustrated in FIG. 4 will be described. A multilayer film for the magnetization measurement is a multilayer film obtained by stacking Ta (5 nm)/CoFeB (1.2 nm)/MgO (2 nm)/Ta (5 nm) in sequence on a Si substrate (see FIG. 3A). As a method for forming the multilayer film, all films were manufactured by RF magnetron sputtering. After the forming of the multilayer film, a magnetic field applying heat treatment was carried out at 300° C. in vacuum. The applied magnetic field was 0.6 T in the film surface direction, and the heat treatment time was 1 hour. Thereafter, a plasma irradiation test was carried out with respect to the multilayer film, by using the ICP (inductively Coupled Plasma) etching apparatus represented in FIG. 6. The used gases are a hydrogen gas and a nitrogen gas, and the hydrogen flow ratio is adjusted by adjusting the flow rate of each gas. In the present example, the hydrogen flow ratio was changed in a scope of 0% to 100%, and a total flow rate of hydrogen and nitrogen was fixed to 200 sccm. As irradiation conditions which are used in the plasma irradiation, the conditions that source power is 1000 W, bias power is 50 W, and Ta on an outermost surface of the multilayer film is not etched are adopted. As a reference sample, a multilayer film which was not irradiated with plasma was prepared as a standard sample. For the magnetization measurement of the multilayer films, VSM (Vibrating Sample Magnetometer: vibration sample type magnetometer) was used. Regarding a sample of which the hydrogen flow ratio of the plasma irradiation was 50% or less, the clear perpendicular magnetic anisotropy was observed as represented in FIG. 3B, but on the contrary, regarding a sample of which the hydrogen flow ratio was 75%, magnetization reversal in the perpendicular direction was not observed. Furthermore, regarding the sample of which the hydrogen flow ratio was 75%, since the magnetization reversal in the in-plane direction was obtained, it was assumed that an easy axis of the magnetization was changed to the in-plane direction. In a case where the hydrogen flow ratio was further increased, resultantly, the easy axis direction of the magnetization was returned to the perpendicular direction again, but a magnitude of the coercive force was reduced up to approximately a half magnitude thereof, in comparison with a sample of which the hydrogen flow ratio was 50%. Regarding each sample, in a case where the perpendicular magnetic anisotropy energy was estimated, it was found out that the value thereof was the smallest at the hydrogen flow ratio of 75%, as illustrated in FIG. 4. From this, it becomes clear that it is possible to reduce the degradation of the interfacial perpendicular magnetic anisotropy of CoFeB, in the region in which the hydrogen flow ratio is 50% or less.

Moreover, as an example of the additional gas, the effect in a case where CO was used was verified. In the present example, two kinds of a case where the mixed gas was not included (hydrogen: 100 sccm, nitrogen: 100 sccm) and a case where the mixed gas was included (hydrogen: 50 sccm, nitrogen: 50 sccm, CO: 50 sccm) were prepared, and the CoFeB perpendicular magnetization film of which the film thickness was 1.2 nm was irradiated with the mixed gas plasma thereof. The configuration of the multilayer film, and the irradiation conditions were as described above, and the magnetic properties were evaluated by using the VSM. In a case where CO was not added, the coercive force was 0.5 (mT), but on the contrary, in a case where CO was added, the coercive force was increased up to approximately 0.8 (mT). From this, it becomes clear that the further low damage processing is possible by the addition of the third additional gas.

REFERENCE SIGNS LIST

1: FIRST RADIO FREQUENCY POWER SOURCE
2: FIRST RADIO FREQUENCY MATCHING DEVICE
3: SECOND RADIO FREQUENCY MATCHING DEVICE
4: SUBSTRATE VOLTAGE GENERATOR
5: END POINT DETERMINATION DEVICE
6: ANTENNA FOR ICP GENERATION

7: FIRST MASS FLOW CONTROLLER
8: SECOND MASS FLOW CONTROLLER
9: SUBSTRATE
10: REACTOR

The invention claimed is:

1. A method for manufacturing a magnetic tunnel junction element, comprising:
forming a multilayer film which has a first magnetic film including at least one of Co, Ni, and Fe, and an oxidation film including at least one of Mg, Zn, and Al, of which a thickness of the first magnetic film is 2 nm or less, and of which the first magnetic film and the oxidation film have an interface in a film surface direction;
forming a mask layer that is patterned on the multilayer film; and
performing etching with respect to the multilayer film on which the mask layer is formed, by using a mixed gas of a hydrogen gas and a nitrogen gas as a reaction gas, wherein a ratio of a flow rate of the hydrogen gas to a flow rate of the mixed gas is 50% or less.

2. The method for manufacturing a magnetic tunnel junction element according to claim 1,
wherein the first magnetic film is formed in an upper layer than the oxidation film,
the first magnetic film is etched, by setting a ratio of the flow rate of the hydrogen gas to the flow rate of the mixed gas to be a first flow ratio,
the oxidation film is etched, by setting a ratio of the flow rate of the hydrogen gas to the flow rate of the mixed gas to be a second flow ratio, and
the second flow ratio is 50% or less, and the first flow ratio is a flow ratio of which a mask selectivity is higher than the second flow ratio.

3. The method for manufacturing a magnetic tunnel junction element according to claim 2,
wherein the multilayer film includes a second magnetic film that is formed in a lower layer of the oxidation film, and
the second magnetic film is etched, in accordance with the second flow ratio.

4. The method for manufacturing a magnetic tunnel junction element according to claim 1,
wherein etching is performed with respect to the multilayer film on which the mask layer is formed, by adding an additional gas to the mixed gas as a reaction gas, and
a rare gas including at least one of He, Ne, Ar, Kr, and Xe, or a gas including at least one of CO, $CO_2$, and O is used as the additional gas.

5. The method for manufacturing a magnetic tunnel junction element according to claim 1,
wherein the first magnetic film is a CoFeB film, and the oxidation film is a MgO film.

6. The method for manufacturing a magnetic tunnel junction element according to claim 1, wherein the mask layer is a Ta film.

* * * * *